（12) United States Patent
Ito et al.

(10) Patent No.: US 9,875,915 B2
(45) Date of Patent: Jan. 23, 2018

(54) METHOD FOR REMOVING METAL CONTAMINATION AND APPARATUS FOR REMOVING METAL CONTAMINATION

(71) Applicant: Tokyo Electron Limited, Tokyo (JP)

(72) Inventors: Yudai Ito, Yamanashi (JP); Kazuya Dobashi, Yamanashi (JP); Misako Saito, Yamanashi (JP); Shigeyoshi Kojima, Kumamoto (JP); Hideki Nishimura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/975,998

(22) Filed: Dec. 21, 2015

(65) Prior Publication Data

US 2016/0175898 A1 Jun. 23, 2016

(30) Foreign Application Priority Data

Dec. 22, 2014 (JP) ................. 2014-259013

(51) Int. Cl.
*H01L 21/67* (2006.01)
*C23C 16/44* (2006.01)
*H01J 37/32* (2006.01)

(52) U.S. Cl.
CPC .... *H01L 21/67017* (2013.01); *C23C 16/4407* (2013.01); *H01J 37/32862* (2013.01)

(58) Field of Classification Search
CPC ... B05C 7/00; H01J 37/32862; C23C 16/4407
See application file for complete search history.

(56) References Cited

U.S. PATENT DOCUMENTS 5,362,328 A * 11/1994 Gardiner ................. C23C 16/18
118/726
6,271,498 B1 * 8/2001 Miyake ............... C23C 16/4405
118/723 VE
2007/0295405 A1 * 12/2007 Okabe ...................... F16K 7/14
137/240

FOREIGN PATENT DOCUMENTS

JP 08-245723 A 9/1996
JP 2004273692 A * 9/2004

OTHER PUBLICATIONS

Machine translation: JP2004273692A; Yamada et al.; 2004.*

* cited by examiner

*Primary Examiner* — Michael Kornakov
*Assistant Examiner* — Natasha Campbell
(74) *Attorney, Agent, or Firm* — Abelman, Frayne & Schwab

(57) ABSTRACT

Disclosed is a method for removing metal contamination present on an inner wall of a fluorine-based resin used in a chemical liquid supply line that supplies a chemical liquid to a workpiece. The method includes bringing some or all of a cleaning material reactive to a metal forming the metal contamination into a gaseous state; supplying the gaseous cleaning material to the chemical liquid supply line; and removing the metal contamination by reacting the gaseous cleaning material with the metal contamination present on the inner wall of the fluorine-based resin used in the chemical liquid supply line.

22 Claims, 8 Drawing Sheets

US 9,875,915 B2

METHOD FOR REMOVING METAL CONTAMINATION AND APPARATUS FOR REMOVING METAL CONTAMINATION

CROSS-REFERENCE TO RELATED APPLICATIONS

This application is based on and claims priority from Japanese Patent Application No. 2014-259013, filed on Dec. 22, 2014 with the Japan Patent Office, the disclosure of which is incorporated herein in its entirety by reference.

TECHNICAL FIELD

The present disclosure relates to a method and an apparatus for removing metal contamination present on an inner wall of a fluorine resin used in a chemical liquid supply line that supplies a chemical liquid to a workpiece.

BACKGROUND

In a manufacturing process of a semiconductor device or a manufacturing process of a flat panel display (FPD), a wet cleaning processing is performed to remove, for example, particles or contamination attached to a semiconductor wafer or a glass substrate that is a workpiece.

In a wet cleaning processing apparatus that performs such a wet cleaning processing, the cleaning processing is performed by supplying an ammonia-based chemical liquid, a hydrofluoric acid-based chemical liquid, or a sulfuric acid-based chemical liquid to a workpiece such as, for example, a semiconductor wafer.

In the wet cleaning processing apparatus, a fluorine resin is generally used for a chemical liquid supply line that supplies the chemical liquid. In the fluorine resin, however, a trace amount of metal is present as metal contamination, which adversely affects the workpiece such as, for example, a semiconductor wafer in the initial state. Since it is required for the workpiece, after the cleaning processing, to have extremely low metal contamination, it is necessary to remove the metal contamination in the fluorine resin used for the chemical liquid supply line in the initial state.

As a method of removing the metal contamination of the fluorine resin, there is known a method of eluting a metal using a cleaning liquid containing an acid such as, for example, hydrochloric acid, hydrofluoric acid, nitric acid, sulfuric acid, or acetic acid (see, for example, paragraphs 0022 to 0023 in Japanese Patent Laid-Open Publication No. 8-245723). Further, in an actual wet cleaning processing apparatus, flushing cleaning of the chemical liquid supply line is performed using, as a cleaning liquid, a chemical liquid for cleaning a workpiece.

SUMMARY

According to an aspect, the present disclosure provides a method for removing metal contamination present on an inner wall of a fluorine-based resin used in a chemical liquid supply line that supplies a chemical liquid to a workpiece. The method includes bringing some or all of a cleaning material reactive to a metal forming the metal contamination into a gaseous state; supplying the gaseous cleaning material to the chemical liquid supply line; and removing the metal contamination by reacting the gaseous cleaning material with the metal contamination present on the inner wall of the fluorine-based resin used in the chemical liquid supply line.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
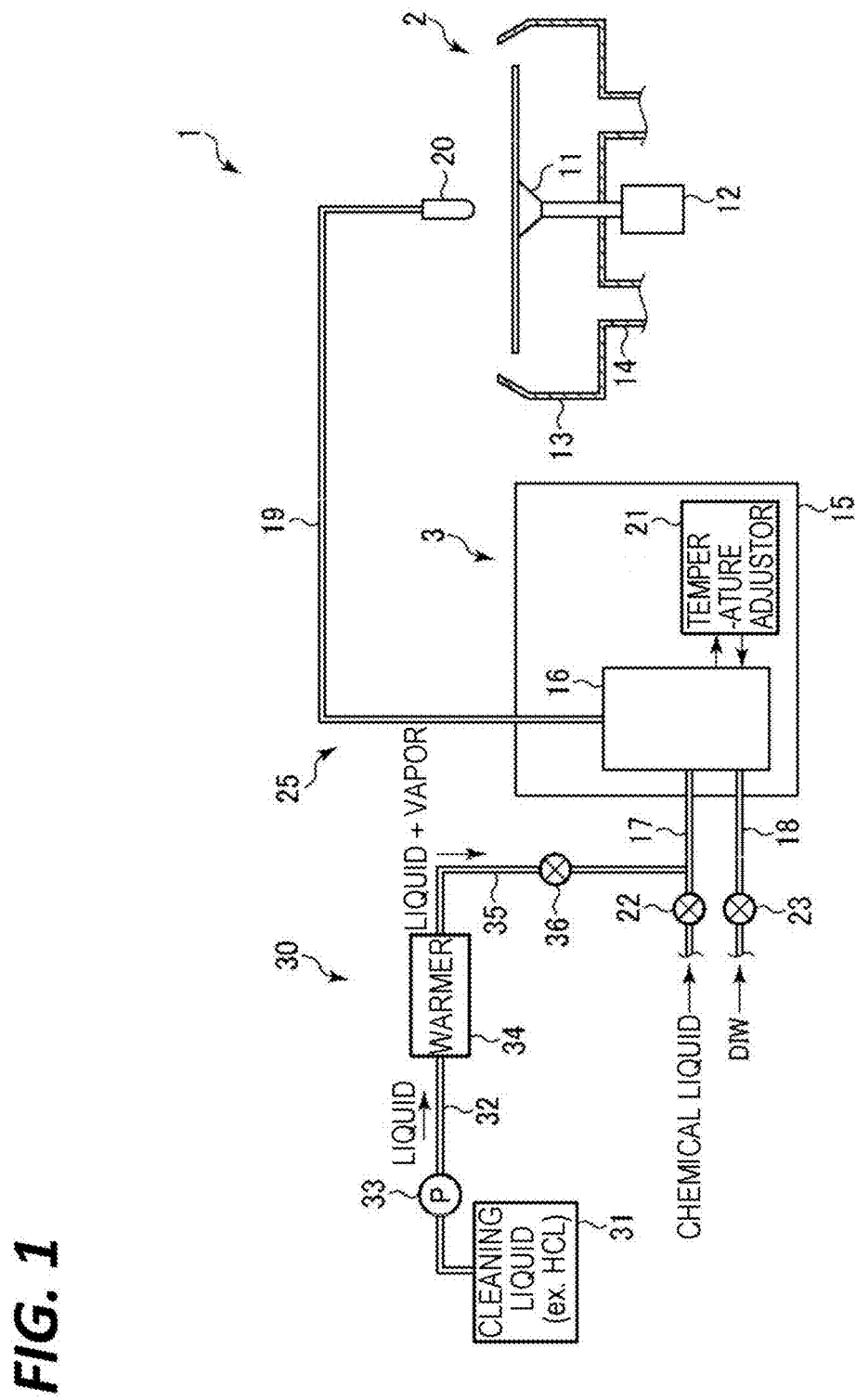
FIG. 1 is a cross-sectional view illustrating a first exemplary cleaning processing apparatus to which a metal contamination removal method of the present disclosure is applied.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In order to reduce the metal contamination to a user request level by the metal contamination removal processing of the chemical liquid supply line by such a cleaning liquid, a long-term processing of several weeks to several months may be required.

The present disclosure has been made in consideration of the problems, and an object of the present disclosure is to provide a method and an apparatus capable of removing metal contamination of a fluorine-based resin used for a chemical liquid supply line for a short period of time.

According to an aspect, the present disclosure provides a method for removing metal contamination present on an inner wall of a fluorine-based resin used in a chemical liquid supply line that supplies a chemical liquid to a workpiece. The method includes bringing some or all of a cleaning material reactive to a metal forming the metal contamination into a gaseous state; supplying the gaseous cleaning material to the chemical liquid supply line; and removing the metal contamination by reacting the gaseous cleaning material with the metal contamination present on the inner wall of the fluorine-based resin used in the chemical liquid supply line.

According to another aspect, the present disclosure provides an apparatus for removing metal contamination present on an inner wall of a fluorine-based resin used in a chemical liquid supply line that supplies a chemical liquid to a workpiece. The apparatus includes a mechanism configured to bring some or all of a cleaning material reactive to a metal forming the metal contamination into a gaseous state; a pipe configured to supply the cleaning material, of which some or all have been gaseous, to the chemical liquid supply line. The metal contamination is removed by reacting the gaseous cleaning material with the metal contamination present on the inner wall of the fluorine-based resin used in the chemical liquid supply line.

In the present disclosure, the cleaning material supplied to the chemical liquid supply line may be brought into a liquid-vapor mixed state by warming the chemical liquid, may be brought into a vapor state by warming the chemical liquid, or may be brought into a vapor state by bubbling the chemical liquid. The cleaning liquid may be an acid or an alkali, or may be suitably selected from the group consisting of hydrochloric acid, nitric acid, and ammonium hydroxide. Particularly, the cleaning liquid may be, inter alia, hydrochloric acid.

In a case where the cleaning material supplied to the chemical liquid supply line is brought into a liquid-vapor mixed state by warming the chemical liquid, when hydrochloric acid is used as the cleaning liquid, a warming temperature may be 40° C. to 100° C., and a concentration of the hydrochloric acid used as the cleaning liquid may be 0.1% by mass to 50% by mass. Further, the hydrochloric acid used as the cleaning liquid may be warmed such that a vapor pressure of the hydrochloric acid is 0.0045 mmHg or more.

A typical example of the metal forming the metal contamination may include aluminum. Further, the chemical liquid supply line may be exemplified with one used in a cleaning processing apparatus for performing a chemical liquid cleaning on the workpiece.

The above-described apparatus may further include a circulating mechanism configured to circulate the cleaning liquid. In addition, the above-described apparatus may further include a purifying mechanism that purifies the cleaning liquid circulated by the circulating mechanism.

According to the present disclosure, since some or all of the cleaning material reactive to a metal forming the metal contamination is brought into a gaseous state and supplied to the chemical liquid supply line, the gaseous cleaning material easily enters minute irregularities of the inner wall of the fluorine-based resin used in the chemical liquid line, and reacts with the metal contamination present in the minute irregularities, so that the metal contamination is removed.

Hereinafter, an exemplary embodiment of the present disclosure will be described with reference to the accompanying drawings.

<Cleaning Processing Apparatus>

First of all, descriptions will be made on an exemplary cleaning processing apparatus to which a metal contamination removal method of the present disclosure is applied. FIG. 1 is a cross-sectional view illustrating an exemplary cleaning processing apparatus to which a metal contamination removal method of the present disclosure is applied.

A cleaning processing apparatus 1 is used to perform a single wafer cleaning processing on a semiconductor wafer (hereinafter, simply referred to as a wafer) W as a workpiece. The cleaning processing apparatus 1 includes a cleaning processing unit 2 that cleans the wafer W, and a liquid supplying unit 3 that supplies a chemical liquid to clean the wafer W disposed in the cleaning processing unit 2.

The cleaning processing unit 2 includes a spin chuck 11 that rotatably holds the wafer W, a motor 12 that rotates the spin chuck 11, and a cup 13 that covers the wafer W held by the spin chuck 11. An exhaust/drain pipe 14 for exhaust and drainage is provided in a bottom portion of the cup 13.

The spin chuck 11 sucks the wafer W by vacuum in a horizontal state, and is moved up the upper side of the cup 13 by an elevating mechanism (not illustrated) when exchanging the wafer W. Further, the spin chuck 11 may mechanically hold the wafer W.

The liquid supplying unit 3 includes a cabinet 15, a tank 16 provided in the cabinet 15, a chemical liquid supply pipe 17 that supplies a chemical liquid to the tank 16, a deionized water supply pipe 18 that supplies deionized water (DIW) to the tank 16, a processing liquid supply pipe 19 that supplies a processing liquid, which is formed by mixing the chemical liquid and the deionized water in the tank 16, to the cleaning processing unit 2, and a processing liquid nozzle 20 that ejects the processing liquid supplied through the processing liquid supply pipe 19, toward the wafer W. In the cabinet 15, a temperature adjustor 21 is provided to adjust the temperature of the processing liquid in the tank 16. The chemical liquid supply pipe 17 and the deionized water supply pipe 18 are provided with a valve 22 and a valve 23, respectively.

The chemical liquid supply pipe 17, the tank 16, the processing liquid supply pipe 19, and the processing liquid nozzle 20 constitute a chemical liquid supply line 25. The chemical liquid supply line 25 is formed of a fluorine-based resin having high corrosion resistance to the chemical liquid. As the fluorine-based resin, a teflon (registered trade name) such as polytetrafluoroethylene (PTFE), a perfluoroalkoxy (PFA) fluorine resin, and a tetrafluoroethylene-hexafluoropropylene (FEP) copolymer, or polychlorotrifluoroethylene (PCTFE) may be exemplified.

The chemical liquid for cleaning the wafer W may be any one conventionally used as a chemical liquid for wafer cleaning, for example, an ammonia-based chemical liquid such as ammonia hydrogen peroxide (SC1), a hydrofluoric acid-based chemical liquid such as dilute hydrofluoric acid (DHF), a sulfuric acid-based chemical liquid such as sulfuric acid hydrogen peroxide (SPM), or a hydrochloric acid-based chemical liquid such as hydrochloric acid hydrogen peroxide (SC2).

In the cleaning processing apparatus 1 as configured above, the wafer W is held on the spin chuck 11 of the cleaning processing unit 2, and the processing liquid is supplied onto the wafer W while rotating the wafer W together with the spin chuck 11. The processing liquid is formed by mixing the chemical liquid and the deionized water in the tank 16. The processing liquid in the tank 16 is supplied to the wafer W through the processing liquid supply pipe 19 and the processing liquid nozzle 20. Thus, a predetermined cleaning processing is performed on the wafer W.

<First Exemplary Metal Contamination Removal Apparatus>

Next, descriptions will be made on a first exemplary metal contamination removal apparatus that performs the metal contamination removal method of the present disclosure. As illustrated in FIG. 1, the chemical liquid supply line 25 is connected with a metal contamination removal apparatus 30 of the present exemplary embodiment. In the fluorine-based resin used for the chemical liquid supply line 25, metal contamination is generated from a processing jig in the manufacturing process, and the metal contamination is removed by the metal contamination removal apparatus 30.

The metal contamination removal apparatus 30 includes a cleaning liquid tank 31 that stores a cleaning material as a cleaning liquid in a liquid state, a cleaning liquid supply pipe 32 that supply the chemical material remaining as the cleaning liquid in a liquid state, from the cleaning liquid tank 31, a cleaning liquid delivery pump 33 provided in the cleaning liquid supply pipe 32, a warmer 34 that warms the cleaning liquid to bring the cleaning material into a liquid-vapor mixed state, and a gas-liquid cleaning material supply pipe 35 that supplies the cleaning material in a liquid-vapor mixed state, to the chemical liquid supply line 25. The gas-liquid cleaning material supply pipe 35 is provided with a valve 36. The gas-liquid cleaning material supply pipe 35 is connected to the chemical liquid supply pipe 17 of the chemical liquid supply line 25. And, the cleaning material passes through the cleaning liquid supply pipe 32 from the cleaning liquid tank 31 while remaining as a cleaning liquid in a liquid state, and reaches the warmer 34. Then, the cleaning material is warmed therein and brought into a liquid-vapor mixed state. Then, the cleaning material is supplied to the chemical liquid supply pipe 17 of the chemical liquid supply line 25 through the gas-liquid cleaning material supply pipe 35 while maintaining the liquid-vapor mixed state.

The metal contamination removal apparatus 30 may include a cleaning liquid circulating mechanism. The circulating mechanism includes a circulation path that returns the chemical liquid after the contaminant metal is removed by supplying the cleaning material in a liquid-vapor mixed state to the chemical liquid supply line 25, to the cleaning liquid tank 31. In this case, a purifying mechanism may be provided in the circulation path to purify the used cleaning liquid. The purifying mechanism may include a recycling and refining mechanism.

<Metal Contamination Removal Processing by First Exemplary Metal Contamination Removal Apparatus>

Next, descriptions will be made on a metal contamination removal processing of the chemical liquid supply line 25 by the first exemplary metal contamination removal apparatus 30 as configured above.

A fluorine-based resin having high corrosion resistance to the chemical liquid is used as a material for the chemical liquid supply pipe 17, the tank 16, the processing liquid supply pipe 19, and the processing nozzle 20, which are used for the chemical liquid supply line 25. As described above, however, metal which adversely affects the wafer W is incorporated from, for example, a processing jig into the fluorine resin in the manufacturing process, and the metal is present as metal contamination. Meanwhile, the wafer W, which is a workpiece, is required to have a very small amount of metal contamination.

Hence, in order to suppress, as much as possible, the metal forming the metal contamination from being supplied from the chemical liquid supply line 25 to the wafer W during the wafer cleaning processing by the cleaning processing apparatus 1, the metal contamination removal processing of the chemical liquid supply line 25 is performed by the metal contamination removal apparatus 30 using a corrosive cleaning material reactive to the removal target metal at the initial stage before starting the cleaning processing of the wafer W.

The removal target metal is a metal that adversely affects the wafer W, and typical examples thereof may include aluminum (Al). Other metals may include Fe, Ni, Cr, Cu, Zn, Li, Na, Mg, K, Ca, Ti, Mn, Co, Sr, Y, Mo, Ba, W, and Pb.

As the cleaning material (cleaning liquid), one having a corrosiveness to react with the metal forming the metal contamination, for example, acid or alkali is used. Specifically, the cleaning material may be exemplified with hydrochloric acid (HCl), nitric acid ($HNO_3$), or ammonium hydroxide ($NH_4OH$), and may be suitably selected depending on the metal to be removed. Among those, hydrochloric acid (HCl) is particularly suitable.

In a conventional metal contamination removal processing, flushing cleaning has been performed by supplying, as a cleaning material, a corrosive cleaning liquid reactive to a removal target metal, for example, a chemical liquid itself that remains in a liquid state, to the chemical liquid supply line. However, it was confirmed that such a technique required a long-term processing over several weeks to several months in order to reduce the metal contamination to a user request level.

As a result of reviewing the cause, the following conclusion was obtained.

Figure 2:
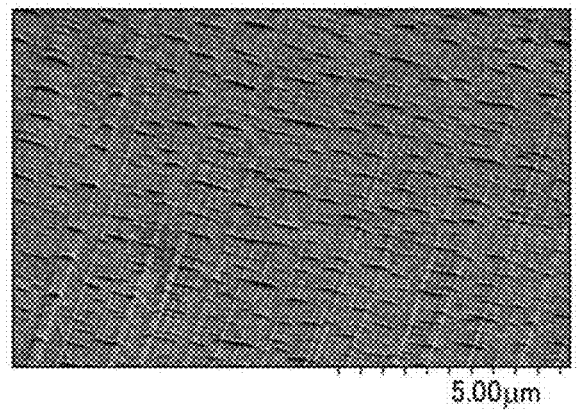
FIG. 2 is a SEM photograph illustrating an inner wall of a tube formed of a fluorine-based resin to which the present disclosure is applied.
Figure 3A:
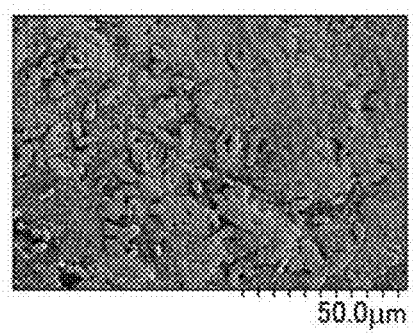
FIGS. 3A and 3B are SEM photographs illustrating an inner wall of an angular bath formed of a fluorine-based resin to which the present disclosure is applied.
Figure 3B:
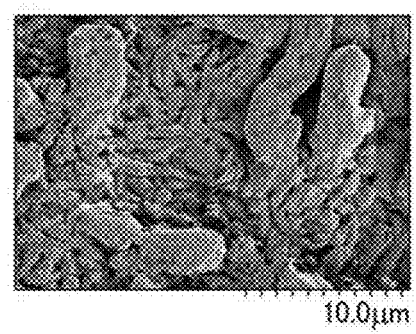

There are many minute irregularities of 100 µm or less in a pipe or tank made of a fluorine-based resin. For example, FIG. 2 is a scanning electron microscope (SEM) photograph illustrating an inner wall of a tube formed of a fluorine-based resin, and it is appreciated that there are many scratches upon the processing. Further, FIGS. 3A and 3B are SEM photographs illustrating an inner wall of an angular bath formed of a fluorine-based resin, and it is appreciated that there are minute and complicated shapes on the surface. The fluorine-based resin is highly water-repellent. Thus, when metal contamination is present inside the minute irregularities, the cleaning liquid cannot infiltrate into the inside, and the metal contamination present inside the minute irregularities is hardly removed directly by the cleaning liquid. Therefore, as the cleaning liquid is provided, the metal contamination present inside the minute irregularities is continuously eluted little by little. This is considered as a cause that makes the flushing cleaning require a long period of time.

Accordingly, in the present example, the metal contamination of the chemical liquid supply line 25 is removed by the cleaning material in a liquid-vapor mixed state using the metal contamination removal apparatus 30 before the cleaning processing apparatus 1 is provided in the cleaning processing of the wafer W. Specifically, the cleaning material stored as a cleaning liquid in a liquid state in the cleaning liquid tank 31 is supplied to the warmer 34 through the cleaning liquid supply pipe 32 while remaining in a liquid state. Then, the cleaning material in a liquid state, that is, the cleaning liquid is warmed to be a liquid-vapor mixed state, and the cleaning material in a liquid-vapor mixed state is supplied to the chemical liquid supply pipe 17 of the chemical liquid supply line 25 through the gas-liquid cleaning material supply pipe 35.

Since the vapor contains particles more minute than the minute irregularities of the fluorine-based resin and also has a permeability to the resin itself, the vapor in the cleaning material in the liquid-vapor mixed state easily enters the minute irregularities. Since the cleaning material is a corrosive material reactive to the metal forming the metal contamination, the vapor that has entered the minute irregularities may react with the metal forming the metal contamination, so that the metal contamination in the minute irregularities is rapidly removed. At this time, the metal forming the metal contamination is removed as it becomes a gas component, or as it becomes an ion in a liquid formed by a dew condensation of the vapor. Further, since the cleaning material is in a liquid-vapor mixed state, the liquid may be rapidly spread out to the minute portions of the chemical liquid supply line 25 while the liquid is maintained at a predetermined temperature.

In order to effectively generate the vapor, the cleaning liquid such as, for example, hydrochloric acid (HCl), nitric acid ($HNO_3$), or ammonium hydroxide ($NH_4OH$), is warmed. However, in order to enhance the metal contamination removal effect by sufficiently supplying the vapor to the minute irregularities, the vapor pressure of the vapor in the cleaning material may be increased. In this regard, the warming temperature of the cleaning liquid may be increased. In a case where hydrochloric acid (HCl) is used as the cleaning liquid, the cleaning liquid may be warmed to 40° C. to 100° C., or may be warmed to 70° C. to 100° C. Further, the concentration of the hydrochloric acid (HCl) used as the cleaning liquid may be 0.1% by mass to 50% by mass. Further, in a case where hydrochloric acid (HCl) is used as the cleaning liquid, the cleaning liquid may be warmed such that the vapor pressure of HCl is 0.0045 mmHg or more.

Further, although the gas-liquid cleaning material supply pipe 35 is connected to a predetermined position of the chemical liquid supply pipe 17 in the chemical liquid supply line 25, the connection site may be appropriately set depending on the site in the chemical liquid supply line 25 where it is intended to remove the metal contamination. The gas-liquid cleaning material supply pipe 35 may be connected to an arbitrary position of the chemical liquid supply pipe 17, or may be connected to the tank 16. In a case of being connected to the tank 16, the warming of the cleaning material may be performed by the temperature adjustor 21.

<Second Exemplary Metal Contamination Removal Apparatus>

Figure 4:
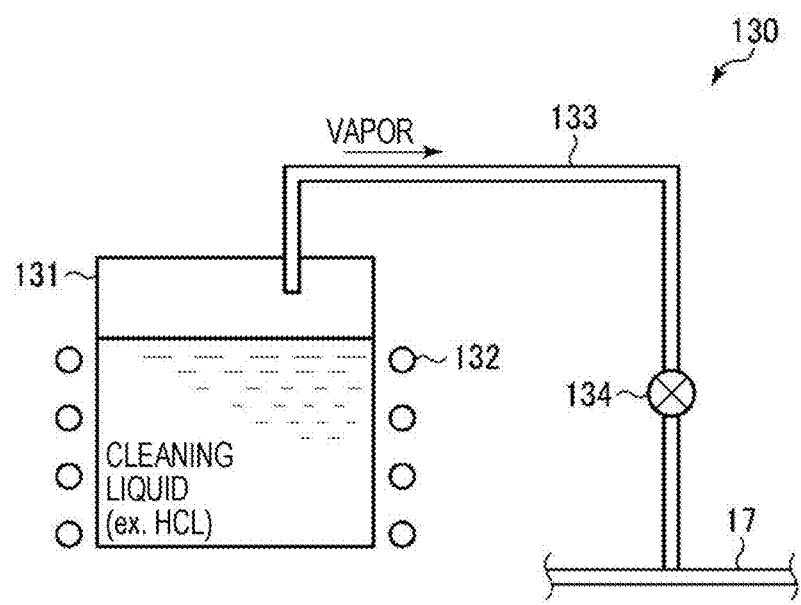
FIG. 4 is a cross-sectional view illustrating a second exemplary metal contamination removal apparatus.

Next, descriptions will be made on a second exemplary embodiment of the metal contamination removal apparatus that performs the metal contamination removal method of the present disclosure. FIG. 4 is a cross-sectional view illustrating the second exemplary metal contamination removal apparatus. In the first exemplary metal contamination removal apparatus, the cleaning material is supplied to the chemical liquid supply line in a liquid-vapor mixed state, but in the present exemplary metal contamination removal apparatus, only vapor is supplied to the chemical liquid supply line. The metal to be removed and the cleaning material (cleaning liquid) are the same as those used in the first exemplary metal contamination removal apparatus.

The second exemplary metal contamination removal apparatus 130 includes a cleaning liquid tank 131 that stores a cleaning material as a cleaning liquid in a liquid state, a heater 132 provided around the cleaning liquid tank 131, and a vapor supply pipe 133 that guides a vapor, which is generated by warming the cleaning material by the heater 132 in the cleaning liquid tank 131, to the chemical liquid supply pipe 17 of the chemical liquid supply line. Further, reference numeral 134 denotes a valve.

In the second exemplary metal contamination removal apparatus 130 configured as described above, the cleaning liquid in the cleaning liquid tank 131 is warmed by the heater 132 to become a vapor, and the vapor is supplied to the chemical liquid supply pipe 17 of the chemical liquid supply line through the vapor supply pipe 133. The supplied vapor may easily infiltrate into minute irregularities of a fluorine-based resin used for the chemical liquid supply line, and react with a metal forming metal contamination therein, so that the metal contamination in the minute irregularities is rapidly removed. In this case, since the cleaning material is formed of the vapor only, the supply property in the chemical liquid supply line 25 is low as compared with the case of the liquid-vapor mixed state. However, a condition may be set such that the cleaning material is sufficiently supplied to a site where removal of the metal contamination of the chemical liquid supply line 25 is required, while ensuring the vapor state. To that end, the vapor pressure of the vapor of the cleaning material may be increased by increasing the temperature of the cleaning liquid such as, for example, hydrochloric acid (HCl), nitric acid ($HNO_3$), or ammonia water ($NH_4OH$). In a case where hydrochloric acid (HCl) is used as the cleaning liquid, the cleaning liquid may be warmed to 40° C. to 100° C., or may be warmed to 70° C. to 100° C. Further, the concentration of the hydrochloric acid (HCl) used as the cleaning liquid may be 0.1% by mass to 50% by mass. Further, in a case where hydrochloric acid (HCl) is used as the cleaning liquid, the cleaning liquid may be warmed such that the vapor pressure of HCl is 0.0045 mmHg or more.

<Third Exemplary Metal Contamination Removal Apparatus>

Figure 5:
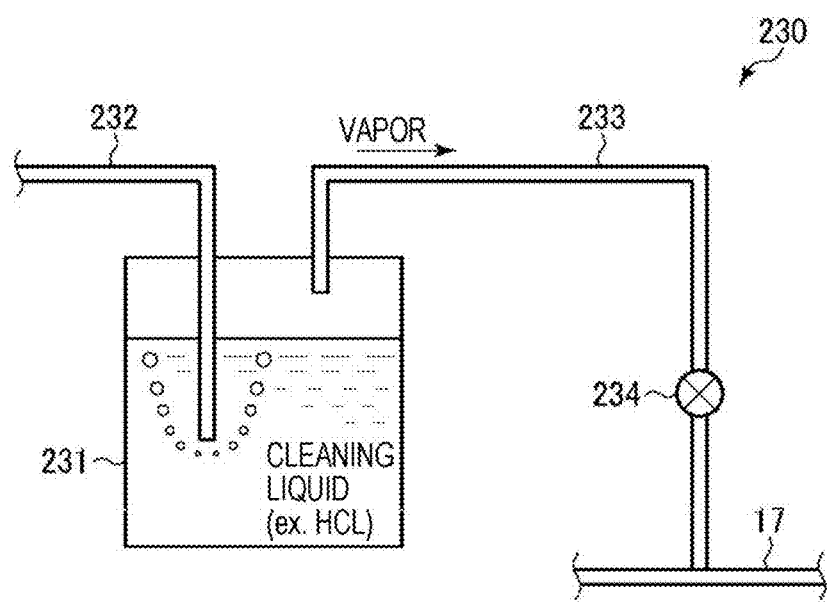
FIG. 5 is a cross-sectional view illustrating a third exemplary metal contamination removal apparatus.

Next, descriptions will be made on a third exemplary metal contamination removal apparatus that performs the metal contamination removal method of the present disclosure. FIG. 5 is a cross-sectional view illustrating the third exemplary metal contamination removal apparatus. In the first and second exemplary metal contamination removal apparatuses, the vapor of the cleaning material is generated by warming the cleaning liquid, but in the third exemplary metal contamination removal apparatus, the vapor of the cleaning material is generated by bubbling without warming the cleaning liquid, and is supplied to the chemical liquid supply line. The metal to be removed and the cleaning material (cleaning liquid) are the same as those used in the first exemplary metal contamination removal apparatus.

The third exemplary metal contamination removal apparatus 230 includes a cleaning liquid tank 231 that stores a cleaning material as a cleaning liquid in a liquid state, a bubbling pipe 232 that supplies a bubbling gas to the cleaning liquid in the cleaning liquid tank 231, and a vapor supply pipe 233 that guides a vapor of the cleaning material, which is generated by bubbling, to the chemical liquid supply pipe 17 of the chemical liquid supply line. As the bubbling gas, an inert gas such as, for example, $N_2$ gas or Ar gas may be used. Further, reference numeral 234 denotes a valve.

In the third exemplary metal contamination removal apparatus 230 configured as described above, the bubbling gas is supplied to the cleaning liquid in the cleaning liquid tank 231, so that the cleaning liquid is bubbled. Then, the vapor generated by the bubbling is supplied to the chemical liquid supply pipe 17 of the chemical liquid supply line through the vapor supply pipe 233. The supplied vapor may easily enter minute irregularities of a fluorine-based resin used for the chemical liquid supply line, and react with a metal forming metal contamination therein, so that the metal contamination in the minute irregularities is rapidly removed. In this case, since the cleaning material is formed of the vapor only, the supply property in the chemical liquid supply line 25 is low as compared with the case of the liquid-vapor mixed state. However, a supply amount of the bubbling gas may be adjusted such that the vapor is sufficiently supplied to a site where removal of the metal contamination of the chemical liquid supply line 25 is required.

Test Examples

Hereinafter, test examples of the present disclosure will be described.

Test Example 1

First of all, a test was performed to confirm the effectiveness of the metal contamination removal method of the present disclosure.

Here, a case where an Al removal processing is performed on an angular bath made of PTFE, which is a fluorine-based resin, (having a microstructure illustrated in FIGS. 3A and 3B).

First of all, a 24-hour elution processing with SC1 (ammonia hydrogen peroxide mixture) that is a chemical liquid used in a cleaning processing of wafers in practice (actual liquid flushing) was performed three times (processing (1)), subsequently, 24-hour elution processing with HCl at normal temperature was performed (processing (2)), subsequently, the 24-hour elution processing with SC1 (actual liquid flushing) was performed once (processing (3)), subsequently, the 24-hour elution processing with HCl at normal temperature was performed (processing (4)), subsequently, an elution processing with HCl in a liquid-vapor mixed state, which was warmed at 80° C., was performed (processing (5)), and finally, the 24-hour elution processing with SC1 (actual liquid flushing) was performed twice (processing (6)).

Figure 6:
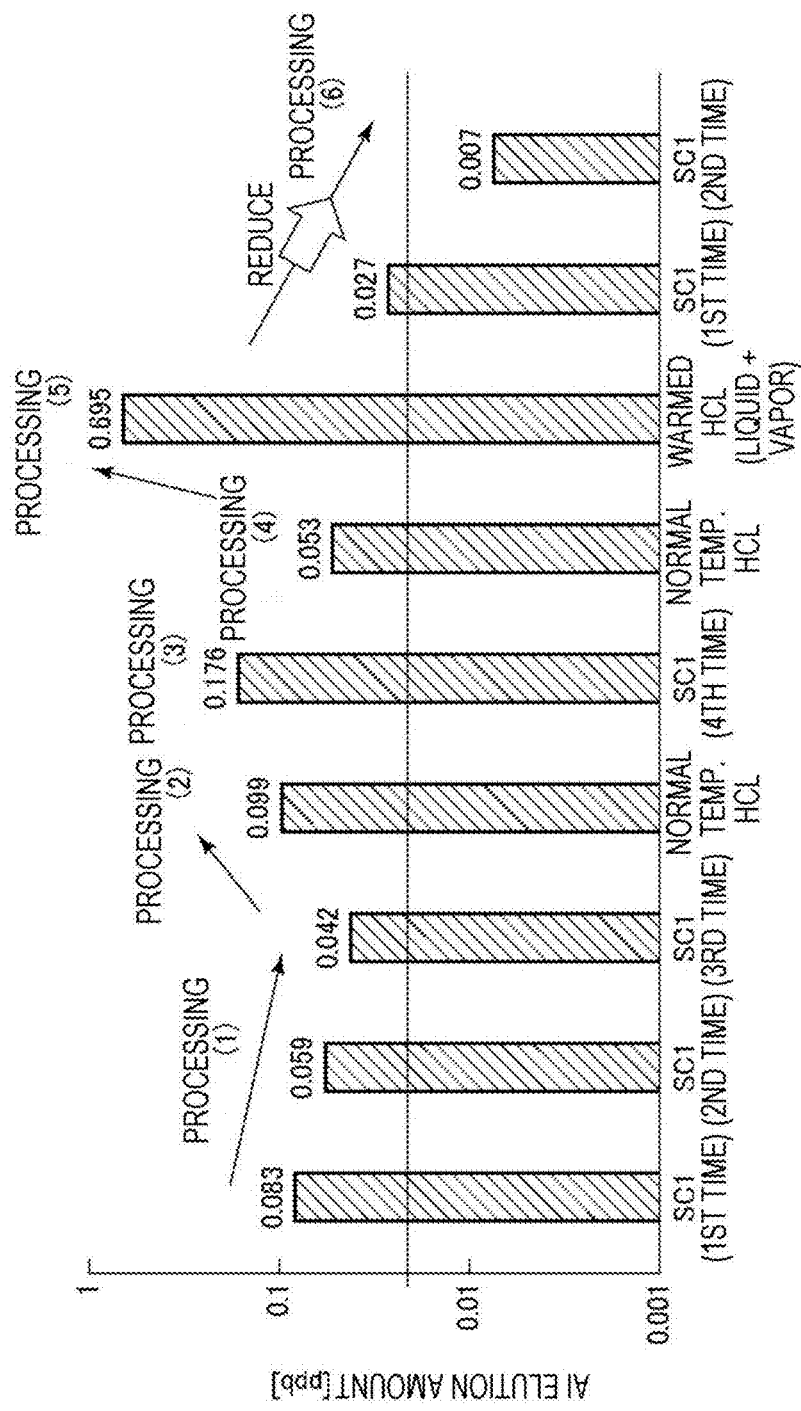
FIG. 6 is a diagram illustrating a result of a test carried out to confirm the effectiveness of the metal contamination removal method of the present disclosure.

The elution concentration of Al in each processing is illustrated in FIG. 6. As illustrated in the figure, processings (1) to (4) are elution processings with SC1 that is an actual liquid, and elution processings with HCl at normal temperature. Al was continuously eluted while the elution concentration of Al was increased or decreased between 0.042 ppb and 0.176 ppb. The subsequent processing (5) is an elution processing with HCl in a liquid-vapor mixed state which corresponds to the processing of the present disclosure. By processing (5), Al of 0.695 ppb, which was the maximum so far, was detected. In the elution processing with SC1 of the subsequent processing (6), the concentration reached 0.027 ppb of a background level at the first time, and becomes 0.007 ppb, which was below 0.02 ppb of a target level, at the second time. It is indicated that, by the method of the present disclosure, the HCl vapor entered the minute irregularities of PTFE, which is the fluorine-based resin used for the angular bath, and effectively acted on Al in the minute irregularities, so that Al in the minute irregularities, which was unable to be removed by a conventional technique, was eluted, and the amount of Al eluted with the subsequent actual liquid (SC1) was effectively reduced.

As for HCl of normal temperature, although a corrosive HCl vapor is generated as well, the generation amount is small, and the amount entering the minute irregularities is very small. Further, since the generated vapor is not condensed, the HCl vapor hardly acts on the Al in the minute irregularities. Therefore, it is considered that a difference in removal effect of Al appears.

Test Example 2

Next, investigation was made on a relationship between a condition in a case where HCl was used as the cleaning material, and the Al removal effect.

Here, after a bent tube made of PFA, which is a fluorine-based resin, was heated at 200° C., a rod made of stainless steel (SUS) was inserted into the PFA tube to correct the bending, and with respect to the scratches formed on the inner wall as illustrated in FIG. 2, an Al removal processing was performed using HCl under various conditions.

Figure 7:
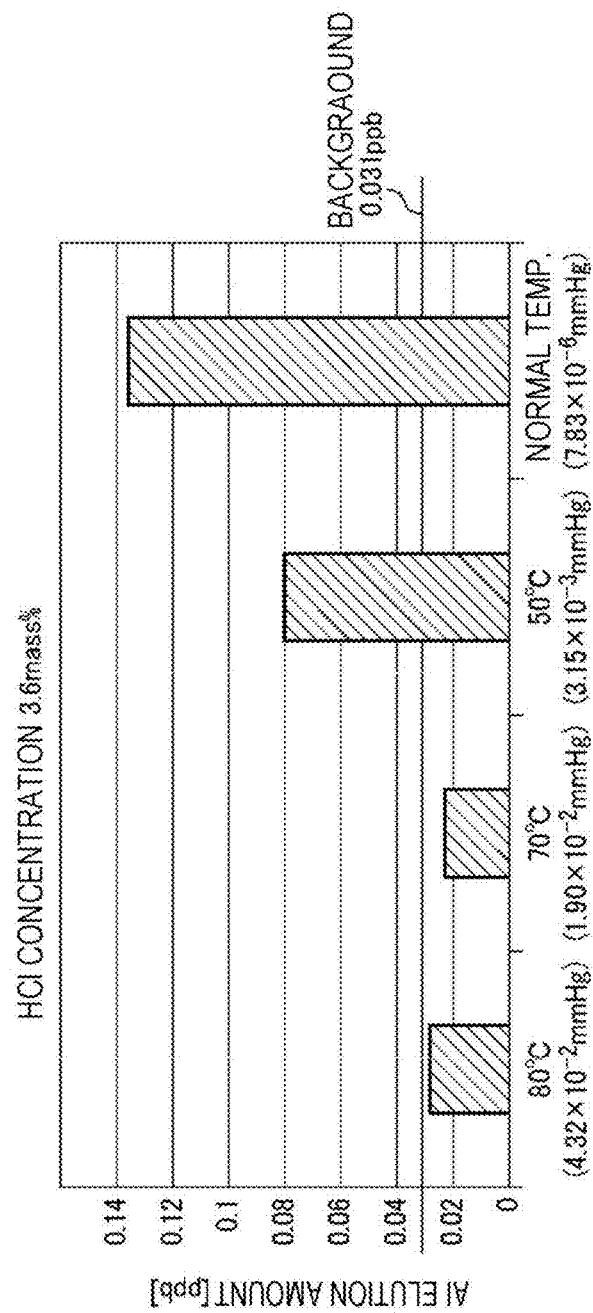
FIG. 7 is a graph illustrating a relationship between a HCl concentration and an Al elution amount when HCl is used as a cleaning material.

First, the influence of the temperature of HCl was investigated. FIG. 7 is a graph illustrating the Al elution amount when the 24-hour elution processing with SC1 was performed after the 24-hour cleaning processing (removal processing) with HCl at various temperatures was performed while the HCl concentration was fixed to 3.6% by mass. Further, in FIG. 7, the vapor pressures of HCl under various conditions are shown together. As illustrated in the figure, in a case where the cleaning processing is performed with HCl at normal temperature, the Al elution amount was 0.136 ppb. On the other hand, in a case of 50° C., the Al elution amount was reduced to 0.080 ppb, so that the effect of the HCl vapor was obtained. Further, in a case of 70° C., the Al elution amount was 0.023 ppb, and in a case of 80° C. was 0.030 ppb. That is, the Al elution amount was further reduced to a value lower than 0.031 ppb of the background level in both cases.

Figure 8:
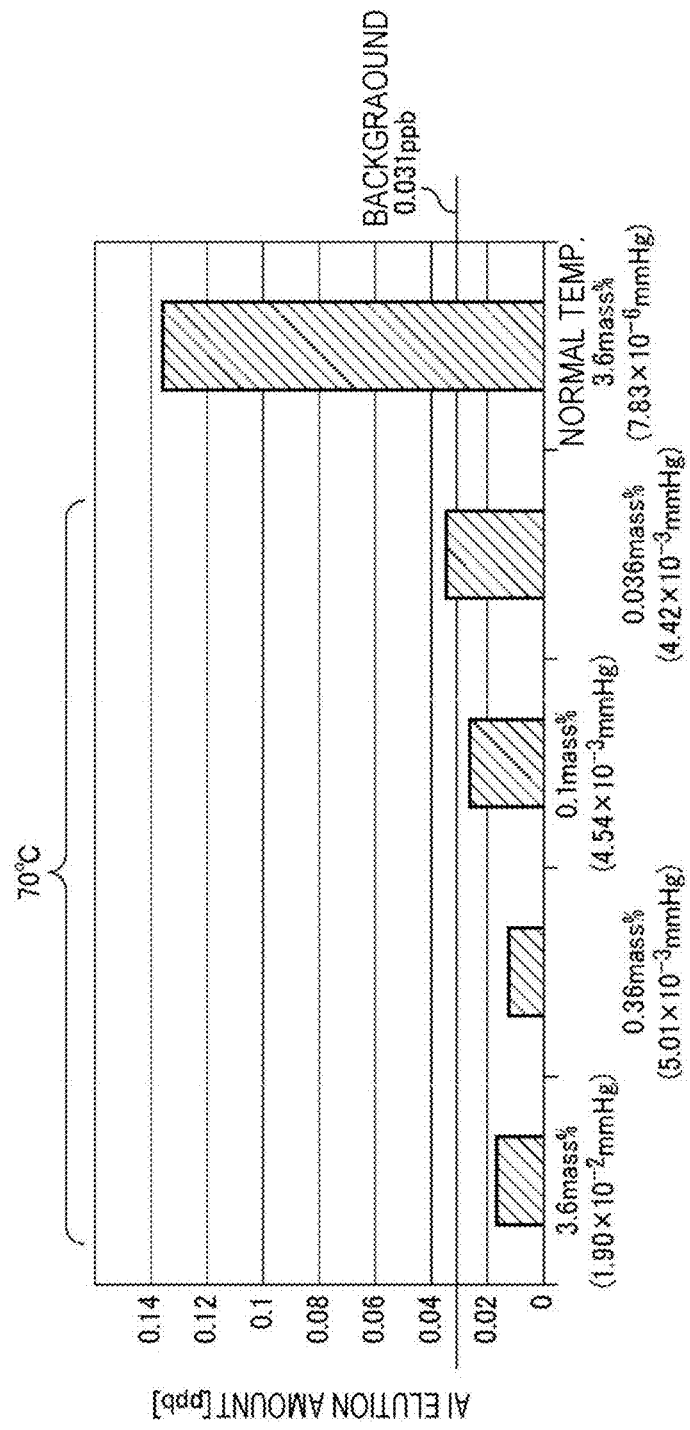
FIG. 8 is a graph illustrating a relationship between a temperature and an Al elution amount when HCl is used as a cleaning material.

Next, the influence of the concentration of HCl was investigated. FIG. 8 is a graph illustrating the Al elution amount when the 24-hour elution processing with SC1 was performed after the 24-hour cleaning processing (removal processing) with HCl at various concentrations was performed while the HCl temperature was fixed to 70° C. Further, in FIG. 8, the results of the 24-hour cleaning processing with HCl at normal temperature and at a concentration of 3.6% by mass are shown together. In addition, the vapor pressure of HCl under respective conditions are also shown together. As illustrated in the figure, when the temperature was 70° C., all the Al elution amounts were shown as low values below 0.035 ppb in the concentration between 0.036% by mass to 3.6% by mass. Particularly, when the concentration was 0.1% by mass or more, the Al elution amount became a value lower than 0.031 ppb of the background level.

Focusing on the vapor pressure of HCl shown in FIGS. 7 and 8, it is confirmed that, when the vapor pressure of HCl is $4.5 \times 10^{-3}$ mmHg (0.0045 mmHg) or more, the Al elution amount becomes a value lower than 0.031 ppb of the background level.

Test Example 3

Next, a test was performed to confirm the Al removal effect when only the HCl vapor was supplied by bubbling.

Here, with respect to a PFA tube having scratches formed on the inner wall in the same manner as in Test Example 2, a case where the Al removal processing was performed using the HCl vapor generated by bubbling HCl at normal temperature was compared with the case where the Al removal processing was performed using HCl at normal temperature.

Figure 9:
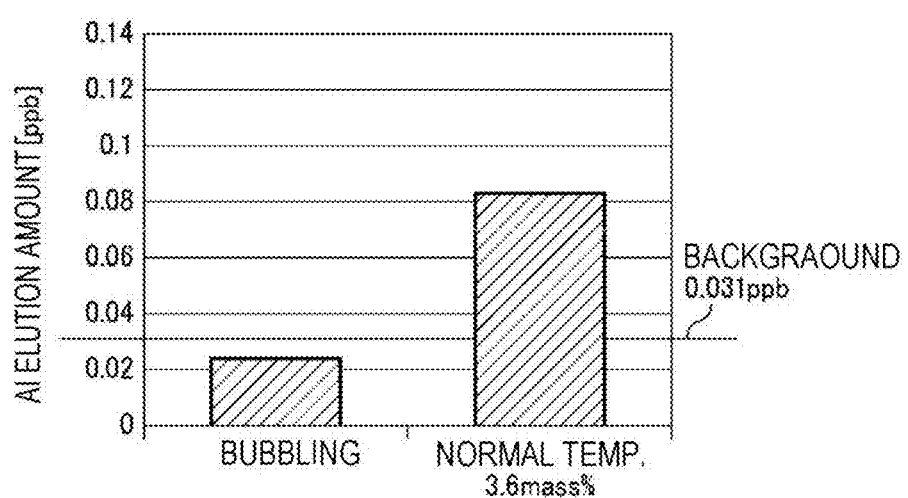
FIG. 9 is a graph illustrating a comparison result of the Al elution amount after the removal processing is performed with HCl vapor generated by bubbling and the Al elution amount after the removal processing is performed with HCl at normal temperature.

Specifically, after the cleaning processing (removal processing) was performed with the HCl vapor generated by bubbling HCl at normal temperature, the Al elution amount was compared with that after the cleaning processing (removal processing) was performed with HCl at normal temperature in 3.6% by mass. The Al elution amount was an Al amount eluted by enclosing SC1 again after the elution was performed once with SC1 for the purpose of rinse. The result is illustrated in FIG. 9. As illustrated in the figure, when the processing was performed with HCl at normal temperature, the Al elution amount was 0.082 ppb. In contrast, when the HCl vapor was supplied by bubbling, the Al elution amount was 0.024 ppb, which was a value lower than 0.031 ppb of the background level.

<Other Applications>

Further, the present disclosure may be modified in various ways without being limited to the above-described exemplary embodiments. For example, the above-described exemplary embodiments have been illustrated with reference to the case where the present disclosure was applied to the chemical liquid supply line used in the cleaning processing apparatus of workpieces. Without being limited thereto, however, the present disclosure is applicable to any processing in which a chemical liquid is supplied to a workpiece by a chemical liquid supply line made of the fluorine-based resin.

Further, the above-described exemplary embodiments were described with respect to the case where the metal contamination was removed by forming a liquid-vapor mixed state of a cleaning liquid by warming, and the case where the metal contamination was removed by using the vapor generated by warming or bubbling the cleaning liquid. Without being limited thereto, however, the metal contamination may be removed using one formed by bringing some or all of the cleaning material into a gaseous state.

Further, the above-described exemplary embodiments were described with respect to the case where the semiconductor wafer was used as a workpiece, but may be applicable to other workpieces such as, for example, a substrate for a flat panel display (FPD).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for removing metal contamination present on an inner wall of a fluorine-based resin used in a chemical liquid supply line that supplies a chemical liquid to a workpiece, the method comprising:
   providing a warmer configured to warm a cleaning liquid in a liquid state to become a liquid-vapor mixed state, the cleaning liquid serving as a cleaning material reactive to a metal forming the metal contamination; an upstream side pipe provided at an upstream side of the warmer and configured to supply the cleaning liquid in the liquid state to the warmer from a cleaning liquid tank, an end of the upstream side pipe that is positioned at a downstream side of the upstream side pipe being connected to the warmer and the other end of the upstream side pipe being connected to the cleaning liquid tank; and a downstream side pipe provided at a downstream side of the warmer that is positioned at an opposite side of the upstream side of the warmer and configured to supply the cleaning liquid from the warmer to the chemical liquid supply line while maintaining the liquid-vapor mixed state, an end of the downstream side pipe being connected to the warmer and the other end of the downstream side pipe being connected to the chemical liquid supply line that is provided at the downstream side of the warmer;
   warming, by the warmer, the cleaning liquid in the liquid state to become the liquid-vapor mixed state;
   supplying, by the downstream side pipe, the cleaning liquid to the chemical liquid supply line while maintaining the liquid-vapor mixed state; and
   removing the metal contamination by reacting the cleaning material in the liquid-vapor mixed state with the metal contamination present on the inner wall of the fluorine-based resin used in the chemical liquid supply line.

2. The method of claim 1, wherein the warming the cleaning liquid includes bringing the cleaning material supplied to the chemical liquid supply line into a vapor state by warming the cleaning liquid.

3. The method of claim 1, further comprising:
   supplying, by a bubbling pipe connected to the cleaning liquid tank, a bubbling gas to the cleaning liquid stored in the cleaning liquid tank such that the cleaning liquid is bubbled, thereby generating a vapor of the cleaning material.

4. The method of claim 1, wherein the cleaning liquid is an acid or an alkali.

5. The method of claim 4, wherein the cleaning liquid is selected from the group consisting of hydrochloric acid, nitric acid, and ammonium hydroxide.

6. The method of claim 1, wherein the cleaning liquid is hydrochloric acid, and a warming temperature is 40° C. to 100° C.

7. The method of claim 6, wherein a concentration of the hydrochloric acid used as the cleaning liquid is 0.1% by mass to 50% by mass.

8. The method of claim 6, wherein the hydrochloric acid used as the cleaning liquid is warmed such that a vapor pressure of the hydrochloric acid is 0.0045 mmHg or more.

9. The method of claim 1, wherein the metal forming the metal contamination is aluminum (Al).

10. The method of claim 1, wherein the chemical liquid supply line is used in a cleaning processing apparatus for performing a chemical liquid cleaning on the workpiece.

11. An apparatus for removing metal contamination present on an inner wall of a fluorine-based resin used in a chemical liquid supply line that supplies a chemical liquid to a workpiece, the apparatus comprising:
   a warmer configured to warm a cleaning liquid in a liquid state to become a liquid-vapor mixed state, the cleaning liquid serving as a cleaning material reactive to a metal forming the metal contamination;
   an upstream side pipe provided at an upstream side of the warmer and configured to supply the cleaning liquid in the liquid state to the warmer from a cleaning liquid tank, an end of the upstream side pipe that is positioned at a downstream side of the upstream side pipe being connected to the warmer and the other end of the upstream side pipe being connected to the cleaning liquid tank; and
   a downstream side pipe provided at a downstream side of the warmer that is positioned at an opposite side of the upstream side of the warmer and configured to supply the cleaning liquid from the warmer to the chemical liquid supply line while maintaining the liquid-vapor mixed state, an end of the downstream side pipe being connected to the warmer and the other end of the downstream side pipe being connected to the chemical liquid supply line that is provided at the downstream side of the warmer,
   wherein
   the metal contamination is removed by reacting the cleaning material in the liquid-vapor mixed state with the metal contamination present on the inner wall of the fluorine-based resin used in the chemical liquid supply line.

12. The apparatus of claim 11, wherein the warmer is further configured to bring the cleaning material into a vapor state by warming the cleaning liquid.

13. The apparatus of claim 11, further comprising:
a bubbling pipe connected to the cleaning liquid tank and configured to supply a bubbling gas to the cleaning liquid stored in the cleaning liquid tank such that the cleaning liquid is bubbled, thereby generating a vapor of the cleaning material.

14. The apparatus of claim 11, further comprising:
a circulating mechanism configured to circulate the cleaning liquid.

15. The apparatus of claim 14, further comprising:
a purifying mechanism configured to purify the cleaning liquid circulated by the circulating mechanism.

16. The method of claim 11, wherein the cleaning liquid is an acid or an alkali.

17. The apparatus of claim 16, wherein the cleaning liquid is selected from the group consisting of hydrochloric acid, nitric acid, and ammonium hydroxide.

18. The apparatus of claim 11, wherein the cleaning liquid is hydrochloric acid, and a warming temperature is 40° C. to 100° C.

19. The apparatus of claim 18, wherein a concentration of the hydrochloric acid used as the cleaning liquid is 0.1% by mass to 50% by mass.

20. The apparatus of claim 18, wherein the hydrochloric acid used as the cleaning liquid is warmed such that a vapor pressure of the hydrochloric acid is 0.0045 mmHg or more.

21. The apparatus of claim 11, wherein the metal forming the metal contamination is aluminum (Al).

22. The apparatus of claim 11, wherein the chemical liquid supply line is used in a cleaning processing apparatus for performing a chemical liquid cleaning on the workpiece.

* * * * *